United States Patent
Tanaka

(10) Patent No.: US 7,531,859 B2
(45) Date of Patent: May 12, 2009

(54) SOLID-STATE IMAGING DEVICE, DRIVING METHOD OF THE SAME AND MANUFACTURING METHOD THEREOF

(75) Inventor: Syouzi Tanaka, Nara (JP)

(73) Assignee: Panasonic Corporation, Osaka (JP)

( * ) Notice: Subject to any disclaimer, the term of this patent is extended or adjusted under 35 U.S.C. 154(b) by 43 days.

(21) Appl. No.: 11/758,293

(22) Filed: Jun. 5, 2007

(65) Prior Publication Data
US 2007/0296844 A1  Dec. 27, 2007

(30) Foreign Application Priority Data
Jun. 21, 2006  (JP) .............................. 2006-171372

(51) Int. Cl.
*H01L 31/062*  (2006.01)
(52) U.S. Cl. .................. 257/292; 257/291; 257/293; 257/E27.133
(58) Field of Classification Search .......... 257/291, 257/292, 293, E27.133
See application file for complete search history.

(56) References Cited
U.S. PATENT DOCUMENTS
2006/0102827 A1  5/2006  Kasuga et al.
2006/0284052 A1  12/2006  Toshikiyo et al.
2007/0146516 A1  6/2007  Nezaki et al.
2007/0165117 A1  7/2007  Toya et al.

OTHER PUBLICATIONS

Moon et al., "The features and characteristics of 5M CMOS image sensor with 1.9×1.9 µm² pixels", Technical Digest of the 2005 International Electron Devices Meeting, pp. 813-816, IEEE.

*Primary Examiner*—Evan Pert
*Assistant Examiner*—Tan N Tran
(74) *Attorney, Agent, or Firm*—Greenblum & Bernstein, P.L.C.

(57) ABSTRACT

The solid-state imaging device in the present invention is a solid-state imaging device that includes plural pixel cells arranged on a semi-conductor substrate, and a driving unit installed on the semi-conductor substrate in order to drive each pixel cell, wherein each pixel cell includes: a photodiode which converts incident light into a signal charge; a transfer transistor which transfers the signal charge of the photodiode to a floating diffusion unit; the floating diffusion unit accumulates the transferred signal charge; and a control implantation layer which is positioned under a gate of the transfer transistor, and becomes a charge transfer path when the charge is transferred from the photodiode to the floating diffusion unit, wherein an impurity concentration of the control implantation layer is denser toward the bottom of the substrate than toward the surface of the semi-conductor substrate.

5 Claims, 15 Drawing Sheets

1a  Read-out control implantation layer
2   Anti-punch-through layer
A-C Charge transfer path
6   Transfer transistor
7   Gate electrode for transfer transistor
8   Photodiode
9   Defect suppression layer
10  Floating diffusion layer (FD unit)
11  Reset transistor
13  Pixel cell
14  Semiconductor substrate
23  Gate electrode for reset transistor
207 Power source diffusion layer
209 Device splitter
P   Gate electrode surface unit
Q   Read-out control implantation layer surface unit

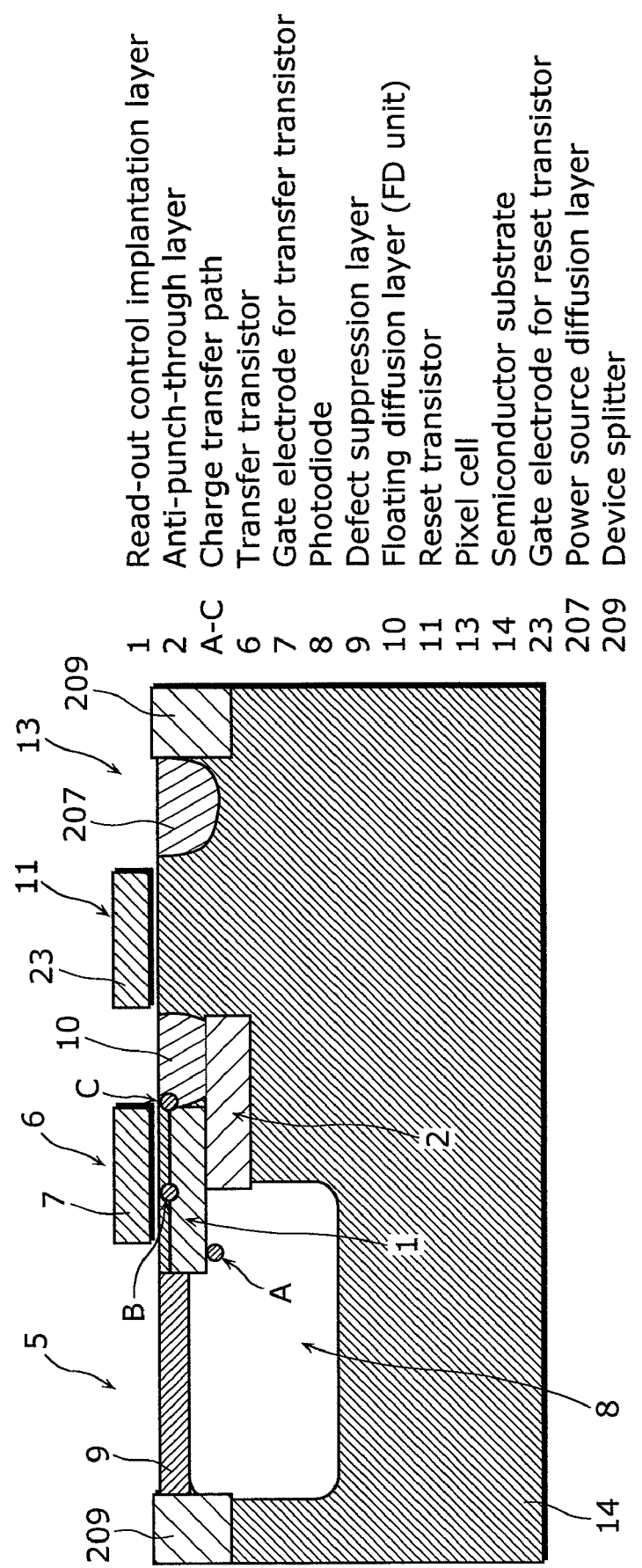

FIG. 5

| | |
|---|---|
| 1 | Read-out control implantation layer |
| 2 | Anti-punch-through layer |
| A–C | Charge transfer path |
| 6 | Transfer transistor |
| 7 | Gate electrode for transfer transistor |
| 8 | Photodiode |
| 9 | Defect suppression layer |
| 10 | Floating diffusion layer (FD unit) |
| 11 | Reset transistor |
| 13 | Pixel cell |
| 14 | Semiconductor substrate |
| 23 | Gate electrode for reset transistor |
| 207 | Power source diffusion layer |
| 209 | Device splitter |

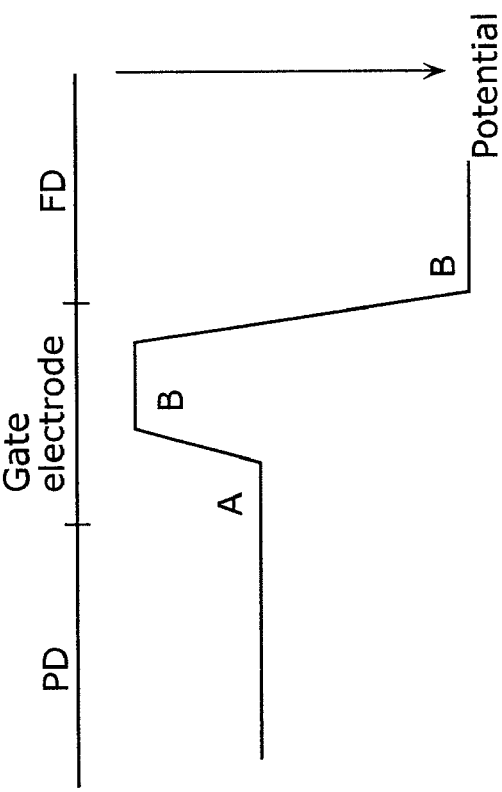
FIG. 6C
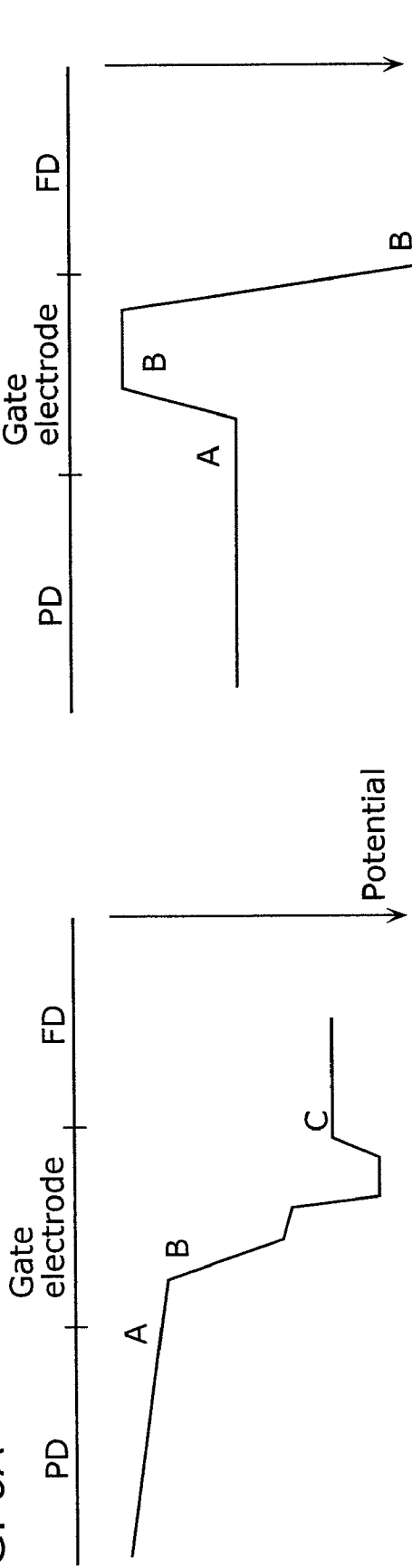
FIG. 6A
FIG. 6B

Gate thickness 200nm (Doped silicon)

FIG. 10L
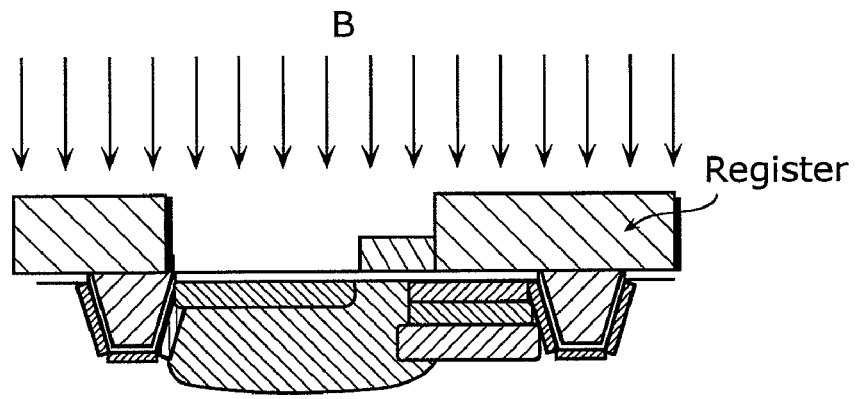
FIG. 10M
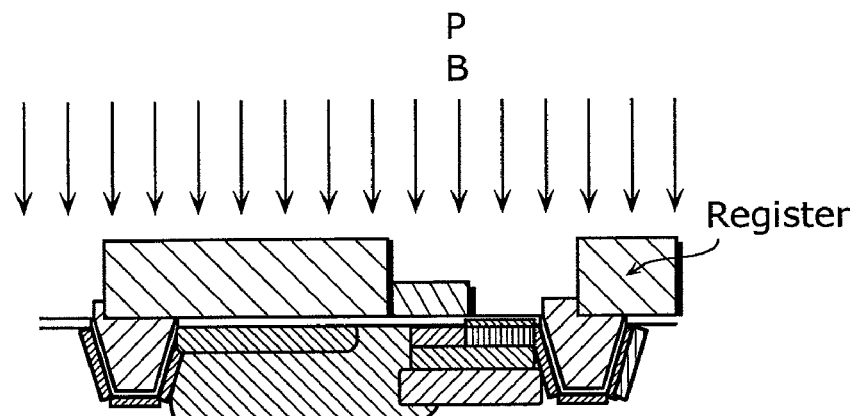
FIG. 10N
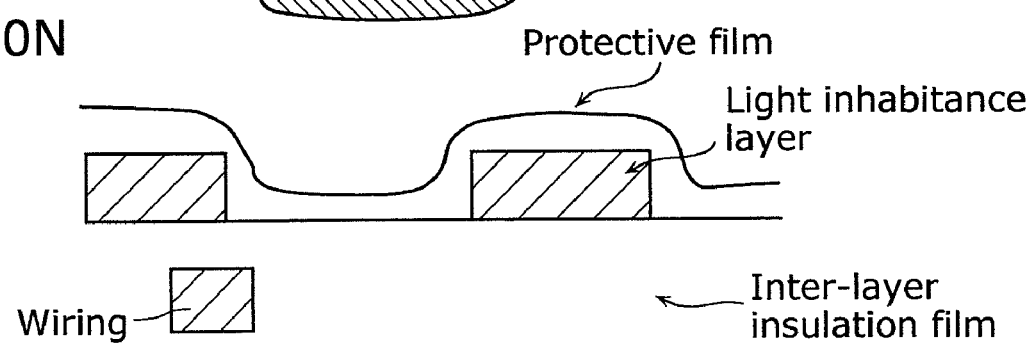
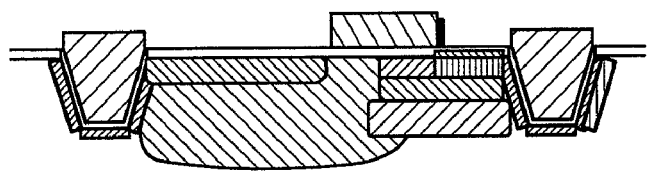

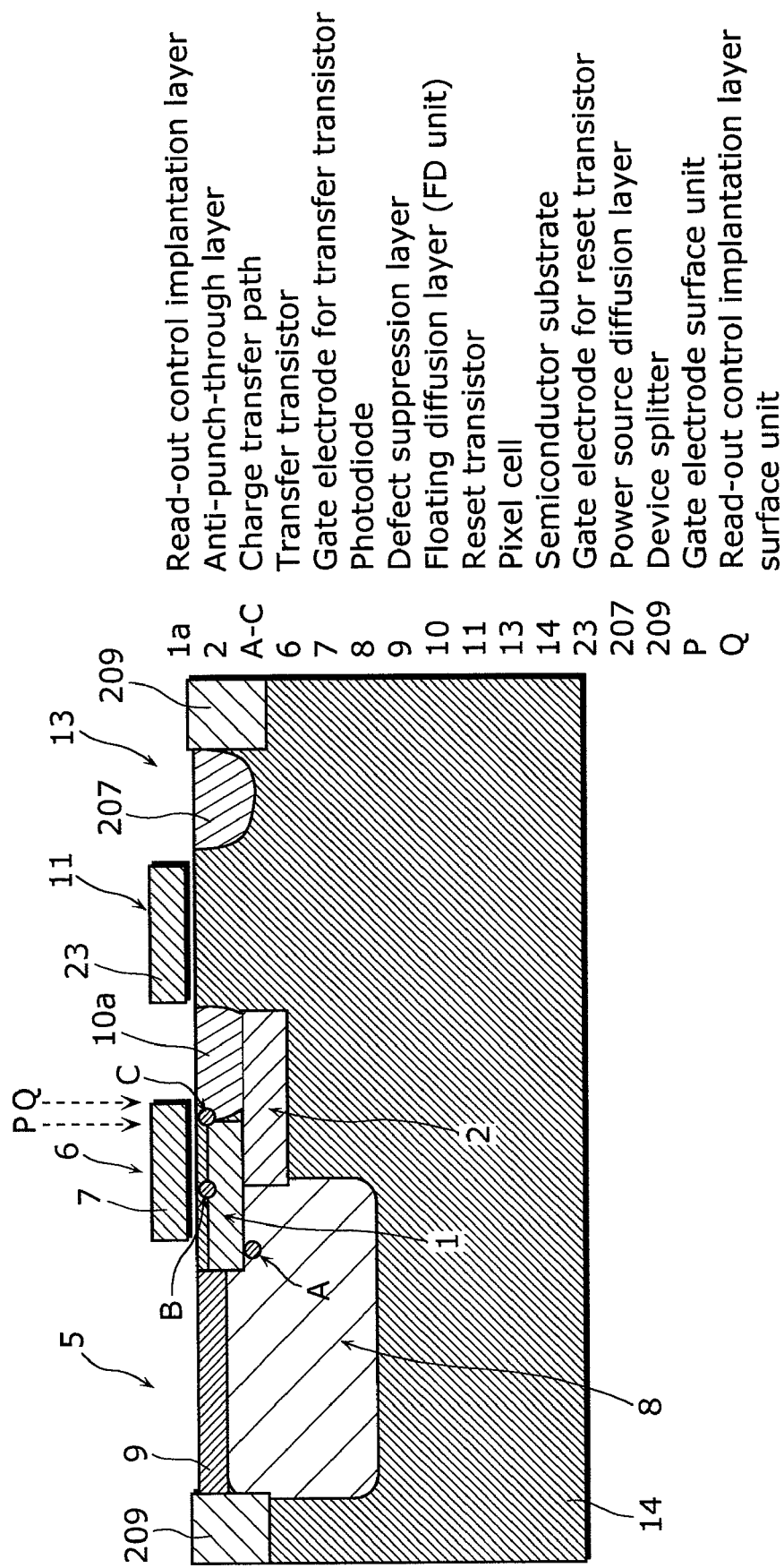

SOLID-STATE IMAGING DEVICE, DRIVING METHOD OF THE SAME AND MANUFACTURING METHOD THEREOF

BACKGROUND OF THE INVENTION (1) Field of the Invention

The present invention relates to a solid-state imaging device in which plural photo-electric converters are allocated in an array shape, and to a driving method and a manufacturing method thereof.

(2) Description of the Related Art

In recent years, the demand for miniaturization of MOS-type solid-state imaging devices has increased. On the other hand, improvements in image quality are also required, and increasing the amount of saturated electrons in photodiode (PD) units, i.e. photo-electric converters, is necessary. Also, when the number of saturated electrons is increased, read defects may easily occur, resulting in an after-image defect. Therefore, it is necessary to increase the capacity of photodiodes and completely transfer charge that is accumulated in a photodiode.

A method used to boost the gate voltage more than the power voltage has been proposed in order to increase the capacity of the photodiode of the solid-state imaging device and completely transfer the charge in the photodiode of the solid-state imaging device.

The conventional solid-state imaging device is designed to improve read-out properties by decreasing the electron potential of the charge transfer circuit below the gate, thereby increasing the gate voltage more than the power voltage in the boost circuit. For example, in Non-Patent Reference 1, 1.32 times 3.3V is studied as a gate voltage for improving the read-out properties compared to a power source voltage of 2.5 V. The general degree of modulation in the transfer transistor is from 0.65 to 0.75, for example, and when the potential in the gate electrode is 3.3V, the potential of the charge transfer path below the gate is between 2.14 and 2.475V. Here, a signal charge may flow from the charge transfer path to the FD unit, since the potential of the charge transfer path below the gate decreases to less than the potential of the FD unit.

[Non-patent Reference 1] IEDM2005 Digest 33-2 "The features and characteristics of 5M CMOS image sensor with 1.9×1.9 μm2 pixels" 2005 IEEE

SUMMARY OF THE INVENTION

However, when the potential of the charge transfer path is set higher than the FD unit by applying voltage to the gate electrode, although potential under the gate increases and the signal charge can be read out of the photodiode which has a lower potential, there is the problem that a part of the signal charge will reflux from the charge transfer path to the photodiode, since the potential under the gate is higher than the potential of the FD unit. In other words, charge accumulates where the potential is high under the gate, causing a reflux in another part of the current and the generation of an after-image defect on the photodiode side, since the accumulated charge is not completely transferred to the FD when the gate is turned OFF. Below, an example is explained.

FIG. 1 is a circuit diagram which shows the structure of the conventional solid-state imaging device 1000. FIG. 2 is a cross-section diagram which shows the conventional structure of the solid-state imaging device. FIG. 3A, FIG. 3B and FIG. 3C are potential diagrams of the charge transfer path from the photodiode to the FD unit. The charge transfer path is shown typically in the figures by points A through C, through which the charge passes. FIG. 3A is a potential diagram for when the read-out gate is turned ON, and shows a potential diagram for when the gate voltage is lower with a dotted line. When the gate voltage is lower, a potential barrier in the C unit of the charge transfer path is generated, and cannot completely transfer the charge in the photodiode. It is necessary to raise the gate voltage in order to completely transfer the photodiode charge, however when the sub-gate voltage is further raised, the sub-gate potential increases to more than the potential FD unit and charge is accumulated below the gate, as in the section surrounded by the solid line in FIG. 3A. FIG. 3B shows with a dotted line the chronological change in potential from the section surrounded by the solid line in FIG. 3A to when the gate is turned off. There is the problem that when the gate is OFF, the charge stored under the gate does not completely flow to the FD side, a portion of the charge refluxes to the photodiode side, as in the diagram.

In order to solve the problem above, the present invention takes as an object providing a solid-state imaging device which prevents charge reflux to the photodiode, improves readability and does not generate a defect in which there are many saturated electrons and an afterimage remains, even when the gate voltage is applied, thereby increasing the potential under the gate to more than the FD unit.

In order to solve the problems above, the present invention is a solid-state imaging device including plural pixel cells arranged on a semi-conductor substrate, and a driving unit installed on the semi-conductor substrate in order to drive each pixel cell, wherein each pixel cell includes: a photodiode which converts incident light into a signal charge; a transfer transistor which transfers the signal charge of the photodiode to a floating diffusion unit; the floating diffusion unit which accumulates the transferred signal charge; and a control implantation layer which is positioned under a gate of the transfer transistor, and becomes a charge transfer path when the charge is transferred from the photodiode to the floating diffusion unit, wherein an impurity concentration of the control implantation layer is denser toward the bottom of the substrate than toward the surface of the semi-conductor substrate.

According to this structure, since a floating diffusion unit is formed, which is denser on the substrate side than near the surface, as a charge transfer path from the photodiode to the floating diffusion unit (below, FD unit) the potential under the transfer transistor when charge is transferred can be inclined in stages on the photodiode side. Thus, charge reflux to the photodiode side can be prevented. As a result, since the signal charge of the photodiode is not lost, the reading properties are excellent and the saturation and after-image properties can be improved.

Here, the driving unit includes a boosting circuit which may boost a power source voltage, and apply the voltage boosted by the boosting circuit to the gate of the transfer transistor as a transfer pulse for transferring the signal charge from the photodiode to the floating diffusion unit.

According to this structure, even when voltage higher than the FD unit is applied to the transfer transistor gate and the potential of the charge transfer path in the floating diffusion unit increases higher than the FD unit, the reading properties are excellent and the saturation and after-image properties can be improved.

Here, the driving unit may supply a transfer pulse, which falls in two stages, to the transfer transistor, as the transfer pulse from the photodiode to the floating diffusion unit.

According to this structure, the sub-gate potential when the transfer transistor is switched from ON to OFF is temporarily held at a potential below the potential of the FD unit, and further, less than the potential of the control implantation layer due to the transfer pulse which falls in two stages. Thus, a complete read-out of the photodiode can be more reliably performed. Deterioration in the reading and saturation properties can be prevented and reliability can be improved.

Here, the photodiode may be formed at a deeper position than the control implantation layer.

Here, a boundary surface of the floating diffusion unit and the control implantation layer may be formed closer to the photodiode than a gate end on the side of the floating diffusion unit.

Also, a driving method for the solid-state imaging device in the present invention is a solid-state imaging device including plural pixel cells arranged on a semi-conductor substrate, and a driving unit installed on the semi-conductor substrate in order to drive each pixel cell, wherein each pixel cell includes: a photodiode which converts incident light into a signal charge; a transfer transistor which transfers the signal charge of the photodiode to a floating diffusion unit; the floating diffusion unit accumulates the transferred signal charge; and a control implantation layer which is positioned under a gate of the transfer transistor, and becomes a charge transfer path when the charge is transferred from the photodiode to the floating diffusion unit, an impurity concentration of the control implantation layer is denser toward the bottom of the substrate than toward the surface of the semi-conductor substrate, and the driving method for the solid-state imaging device includes supplying the transfer pulse, which falls in two stages, to the transfer transistor as a transfer pulse from the photodiode to the floating diffusion unit.

Here, the transfer pulse rises to a voltage higher than a power source voltage and falls in two stages.

Also, a manufacturing method for a solid-state imaging device is a manufacturing method for a solid-state imagine device which includes: a solid-state imaging device including plural pixel cells arranged on a semi-conductor substrate, and a driving unit installed on the semi-conductor substrate in order to drive each pixel cell, wherein each pixel cell comprises: a photodiode which converts incident light into a signal charge; a transfer transistor which transfers the signal charge of the photodiode to a floating diffusion unit; the floating diffusion unit accumulates the transferred signal charge; and a control implantation layer which is positioned under a gate of the transfer transistor, and becomes a charge transfer path when the charge is transferred from the photodiode to the floating diffusion unit, wherein the manufacturing method for the solid-state imaging device includes: forming the photodiode; and forming the control implantation layer such that an impurity concentration of the control implantation layer becomes denser on the side of the substrate than on a surface of the semi-conductor.

Here, the forming of the control implantation layer may include implanting an impurity at a first concentration into a region on the side of the substrate of the control implantation layer; and forming the control implantation layer by implanting an impurity into the control implantation layer at a second concentration, which is less concentrated than the first concentration.

Here, the forming of the control implantation layer may include implanting a first conduction type impurity at a first concentration into a region of the substrate of the control implantation layer; and forming the control implantation layer by implanting a second conduction type impurity into a surface-side region of the control implantation layer at a second concentration, which is less concentrated than the first concentration.

Here, the manufacturing method for the solid-state imagine device may further include forming a gate of the transfer transistor after forming the photodiode, and forming the control implantation layer may include implanting the impurity into the control implantation layer region after forming the gate.

According to the present invention, charge reflux to the photodiode side can be prevented. As a result, since the signal charge of the photodiode is no longer lost, the reading properties are excellent and the saturation and after-image properties can be improved.

Also, even when a voltage higher than the FD unit is applied to the transistor gate and the potential of the charge transfer path in the floating diffusion unit increases higher than the FD unit, the reading properties are excellent, and the saturation and after-image properties can be improved.

Further, a complete read-out of the photodiode can be more reliably performed due to the transfer pulse which falls in two stages. Deterioration in the reading and saturation properties can be prevented and reliability can be improved.

FURTHER INFORMATION ABOUT TECHNICAL BACKGROUND TO THIS APPLICATION

Japanese Patent application No. 2006-171372 filed on Jun. 21, 2006 is incorporated herein by reference.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5 is a cross-section diagram which shows the structure of the solid-state imaging device;

FIG. 6A is a schematic diagram which shows changes in the potential from the photodiode to the FD unit;

FIG. 6B is a schematic diagram which shows changes in the potential from the photodiode to the FD unit;

FIG. 6C is a schematic diagram which shows changes in the potential from the photodiode to the FD unit;

FIG. 10L is a diagram which shows a first manufacturing method of the solid-state imaging device;

FIG. 10M is a diagram which shows a first manufacturing method of the solid-state imaging device;

FIG. 10N is a diagram which shows a first manufacturing method of the solid-state imaging device;

FIG. 13 is a cross-section diagram which shows the solid-state imaging device in the modification.

DESCRIPTION OF THE PREFERRED EMBODIMENT(S)

First Embodiment

A read-out control implantation layer is formed in the solid-state imaging device in the present embodiment such that the impurity concentration of the read-out control implantation layer is denser on the substrate-side than on the surface of the semiconductor substrate, the read-out control implantation layer forming a charge transfer path when transferring a charge from a photodiode to a floating diffusion unit (FD). The potential below the gate of the transfer transistor can be inclined in stages on the photodiode side while transferring the charge.

For that reason, the present invention aims to prevent charge reflux to the photodiode side.

Also, voltage amplified higher than the power source voltage is applied to a gate in the transfer transistor as a read-out pulse. Further, the read-out pulse is generated such that it falls in two stages. In this way, the present invention can reliably prevent charge reflux to the photodiode side.

Below, the solid-state imaging device in the embodiment of the present invention is explained with reference to the diagrams.

Figure 1:
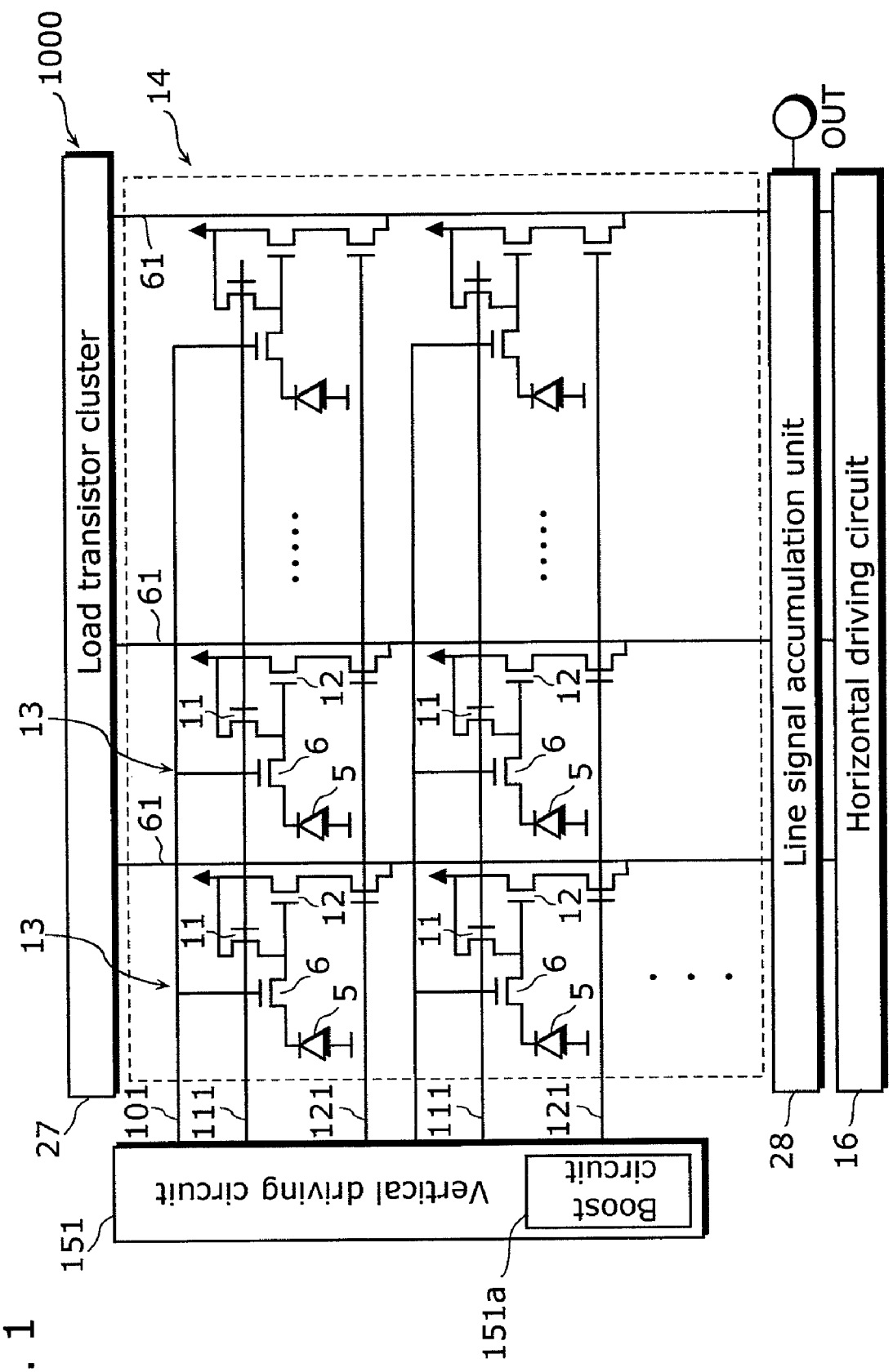
FIG. 1 is a circuit diagram which shows the structure of a solid-state imaging device in the prior art.
Figure 2:
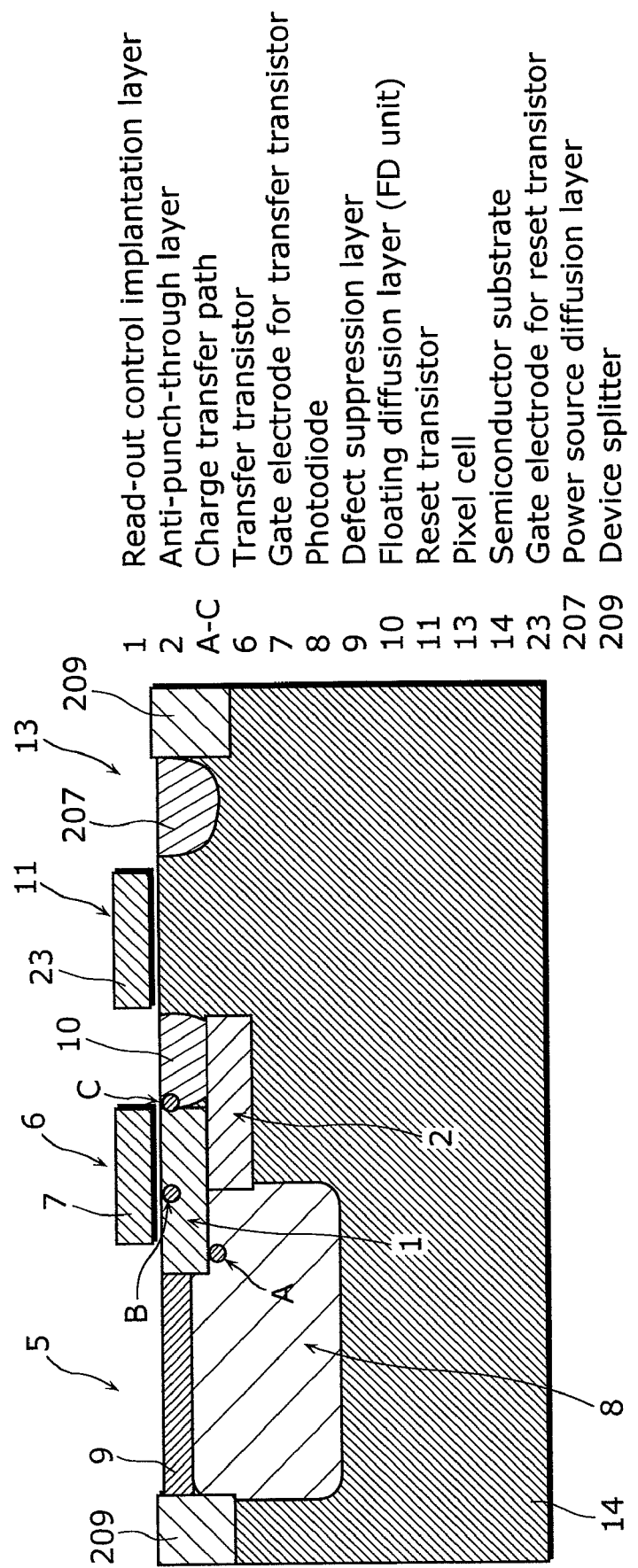
FIG. 2 is a cross section diagram which shows the structure of the solid-state imaging device in the prior art.
Figure 3A:
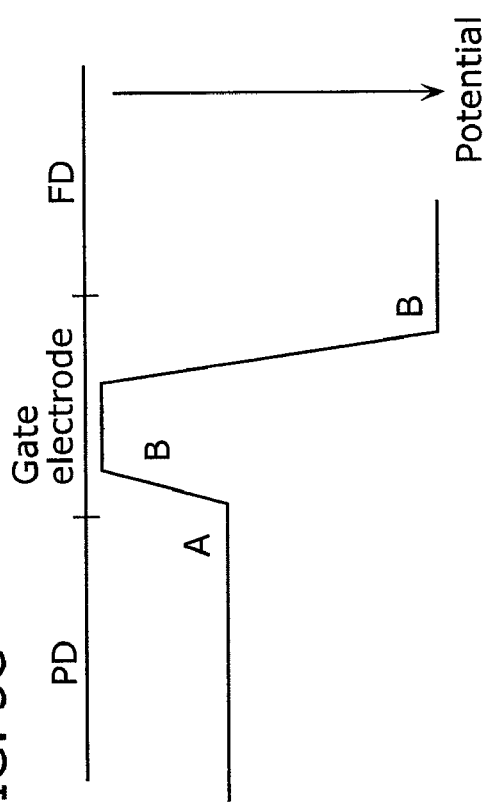
FIG. 3A is a schematic diagram which shows changes in potential from the photodiode to the FD unit.
Figure 3B:
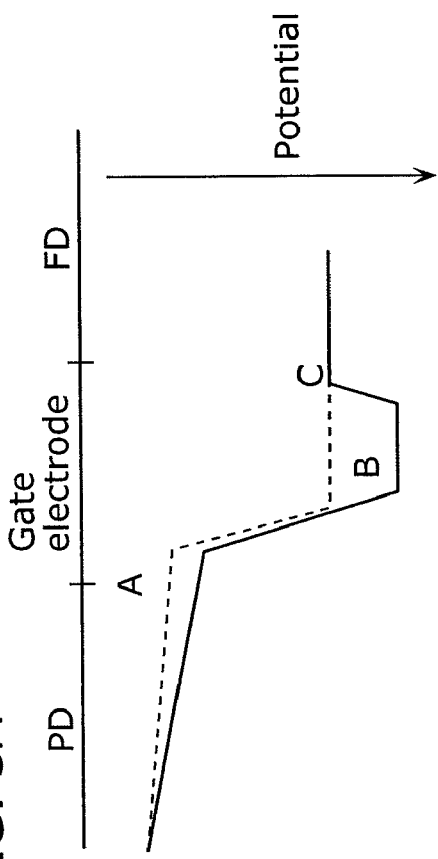
FIG. 3B is a schematic diagram which shows changes in potential from the photodiode to the FD unit.
Figure 3C:
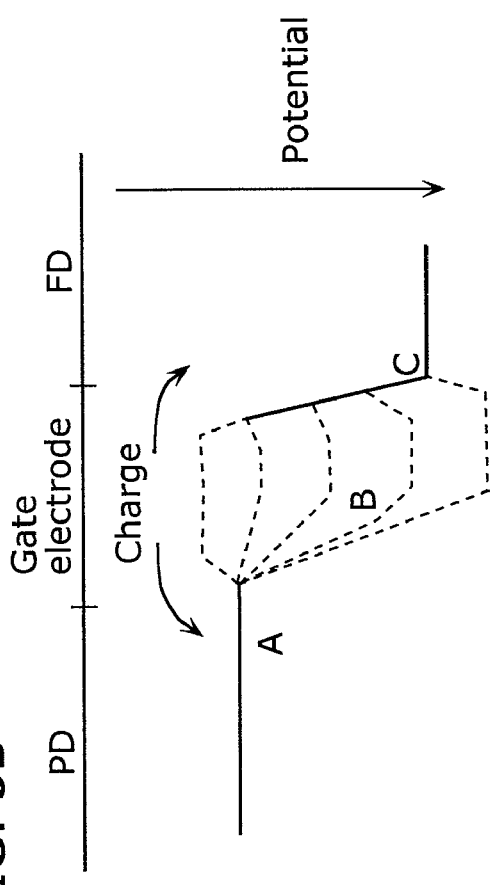
FIG. 3C is a schematic diagram which shows changes in potential from the photodiode to the FD unit.
Figure 4:
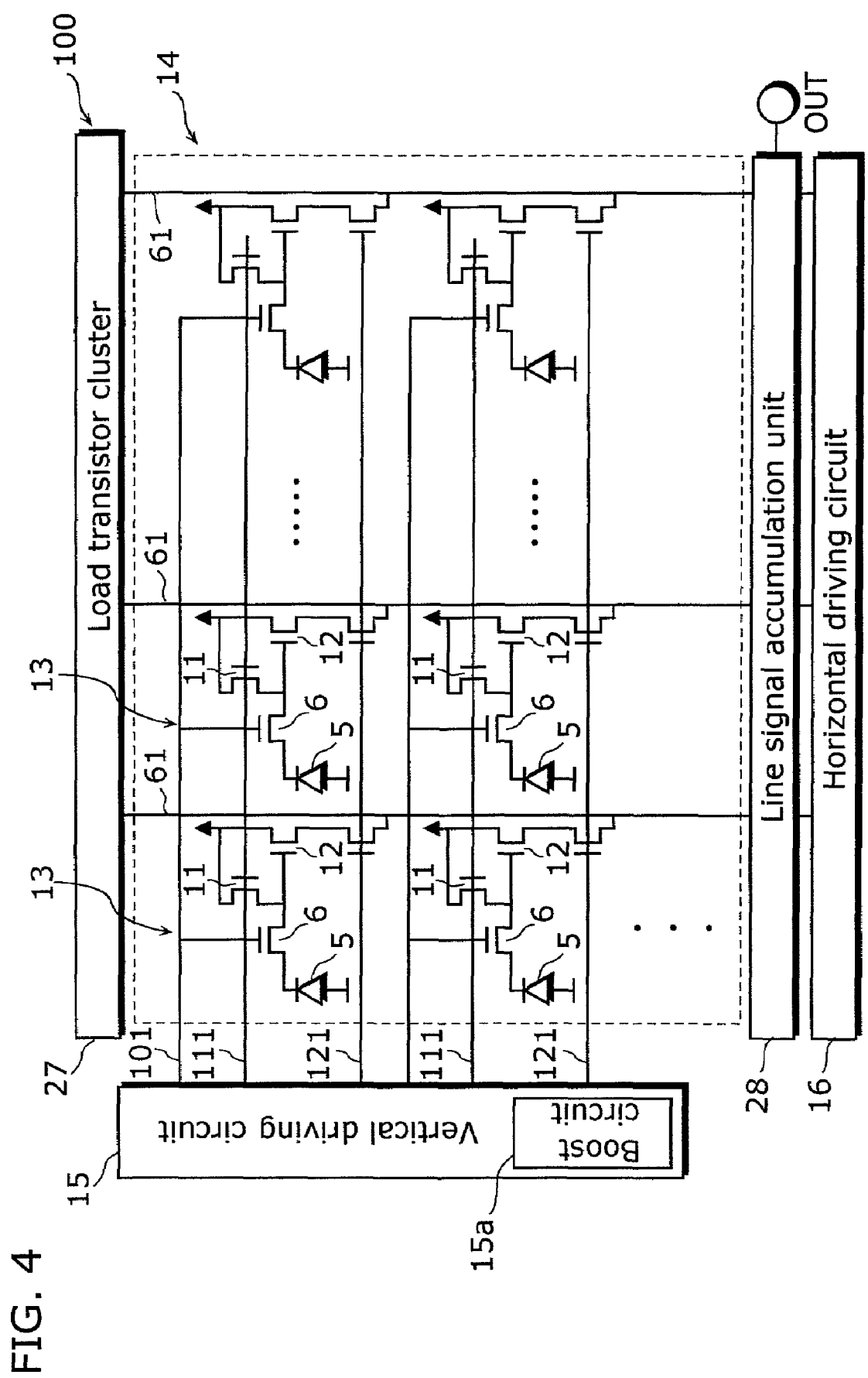
FIG. 4 is a circuit diagram which shows the structure of a solid-state imaging device according to the present embodiment.

FIG. 4 is a circuit diagram which shows the structure of the solid-state imaging device 100 according to the present embodiment.

The solid-state imaging device 100 includes plural pixel cells 13 arrayed in a matrix on a semiconductor substrate 14, a vertical driving circuit 15, a horizontal driving circuit 16, a line signal accumulation unit 28 and a load transistor cluster 100. A boost circuit 15a, which boosts the power source voltage, is included in the vertical driving circuit 15.

Each pixel cell 13 includes a photodiode 5 which converts incident light into a signal charge and accumulates the signal charge, a transfer transistor 6 which reads out (or transfers) the signal charge in the photodiode, a control implementation layer (below, FD unit) which accumulates the signal charge transferred to the drain side of the transfer transistor 6, a reset transistor 11 which resets the FD unit, and an amplification transistor 12 which amplifies the signal charge in the FD unit.

Plural transfer transistor control wires, plural reset transistor control wires 111 and plural vertical selection transistor control wires 121 are connected to the vertical driving circuit 15.

A transfer transistor control wire 101 is connected to a transfer transistor 6 which is installed in each pixel cell 13, and outputs a transfer pulse for transferring the signal charge to the FD unit from the photodiode 5, the pixel cells 13 being configured horizontally. The transfer pulse is a voltage pulse boosted by the boost circuit 15a.

Each reset transistor control wire 111 is configured horizontally and in parallel, separated by a predetermined distance such that the reset control wires 111 connect to each reset transistor 11 installed in each pixel cell 13, the pixel cells 13 being configured horizontally.

Each vertical selection transistor control wire 121 is configured horizontally and in parallel, separated by the predetermined distance such that each vertical selection transistor control wire 121 connect to each vertical selection transistor installed in each pixel cell 13, the pixel cells 13 being configured horizontally.

The vertical selection transistor source is connected to the vertical signal wire 61. A load transistor cluster 27 is connected to one end of each vertical signal wire 61. The other end of each vertical signal wire 61 is connected to the line signal accumulation unit 28. The line signal accumulation unit 28 includes switch transistors which load the signals for one line. A horizontal driving circuit 16 is connected to the line signal accumulation unit 28.

FIG. 5 is a cross-section diagram which shows the structure of the solid-state imaging device 100 according to the present embodiment. FIG. 6A, FIG. 6B and FIG. 6C are schematic diagrams which show changes in the potential in the charge transfer path from the photodiode to the transfer transistor by the read-out control implantation layer which is installed in the solid-state imaging device according to the present embodiment.

The photodiode 5 is an embedded pn format which includes a rough P-type defect suppression layer 9 formed on the surface of the semiconductor substrate 14 and a deep photodiode diffusion layer 8 formed on the underside of the rough P-type photodiode diffusion layer 9 such that the deep photodiode diffusion layer 8 juts out from the surface of the semiconductor substrate 14.

The transfer transistor 6 is formed so that it connects with the photodiode 5, and includes a gate electrode 7 which is formed on top of the semiconductor substrate 14. An FD unit 10 is formed on the surface of the semiconductor substrate 14, which is on the opposite side of the photodiode 5 with respect to the transfer transistor 6. The reset transistor 11 is formed on the semiconductor substrate 14 on the opposite side of the transfer transistor 6 relative to the FD unit 10 and includes a gate electrode 23. A power source diffusion layer 207 is formed on the surface of the semiconductor substrate 14, which is on the opposite side of the floating diffusion unit 10 relative to the reset transistor 11. A device splitter 209 is formed respectively on the opposite side of the reset transistor 11 relative to the power source diffusion layer 207 as well as on the opposite side of the transfer transistor 6 relative to the photodiode 5.

A read-out control implantation layer 1, for controlling the read-out potential from the photodiode 5 to the transfer transistor 6, and stopping charge reflux from places where the sub-gate potential is high into the load photodiode, is formed on the semi-conductor substrate 14 on the underside of the gate electrode, the gate electrode being built into the transfer transistor.

The read-out control implantation layer 1 is formed so that the impurity concentration is at its highest at a position 0.1 micrometers (µm) in depth from the surface of the semi-conductor substrate 14.

In order to follow the impurity distribution of the read-out control implantation, the solid-state imaging device configured in this way must not reflux charge to the photodiode side due to always having a potential on the photodiode side which is higher than the potential of the underside of the FD gate. FIG. 6A is a potential shape of the charge transfer path when the gate voltage is ON, in which charge can be completely transferred from the photodiode; in FIG. 6B, charge reflux does not occur when the sub-gate potential changes transiently when the gate is turned from ON to OFF.

The effect of the solid-state imaging device configured thereof improves, in which the charge stored below the gate stops refluxing to the photodiode side when the read-out gate is turned on, due to the gate voltage in the transitory state between ON to OFF as shown in FIG. 6B being temporarily held at the same potential.

Figure 7:
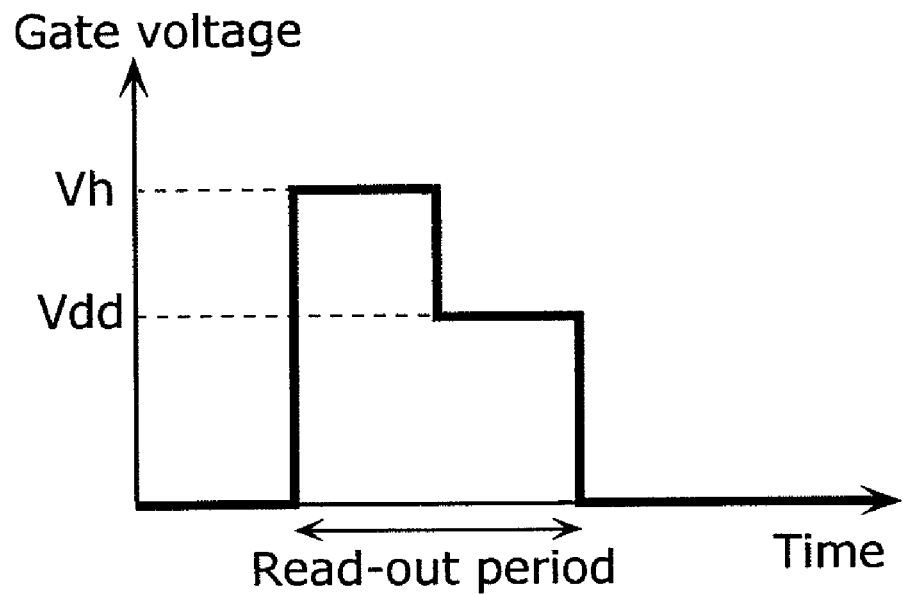
FIG. 7 is a diagram which shows the driving method of the solid-state imaging device.

FIG. 7 is a diagram which shows the driving method for the solid-state imaging device. The vertical driving circuit 15 outputs a transfer pulse as pictured in FIG. 7 to a transfer transistor control wire 101 when the charge is read out. In the figure, the voltage Vdd indicates a high level voltage (for example, 2.9V) corresponding to the power source voltage, and the voltage Vh indicates a voltage boosted (for example, 5V) from the source voltage in the boost circuit 15a. In this way, the vertical driving circuit 15 supplies the transfer pulse, which falls in a two-stage model, to the gate of the transfer transistor 6 as a transfer pulse for reading out the charge from the photodiode 8 to the FD unit 10. Since the transition is a two-stage model, charge reflux can be more reliably prevented when the charge is read out.

Note that the transfer pulse does not need to be boosted, and the transition may be a rectangular and not a two-stage pulse. In this case, charge reflux to the photodiode side can be prevented.

Figure 8:
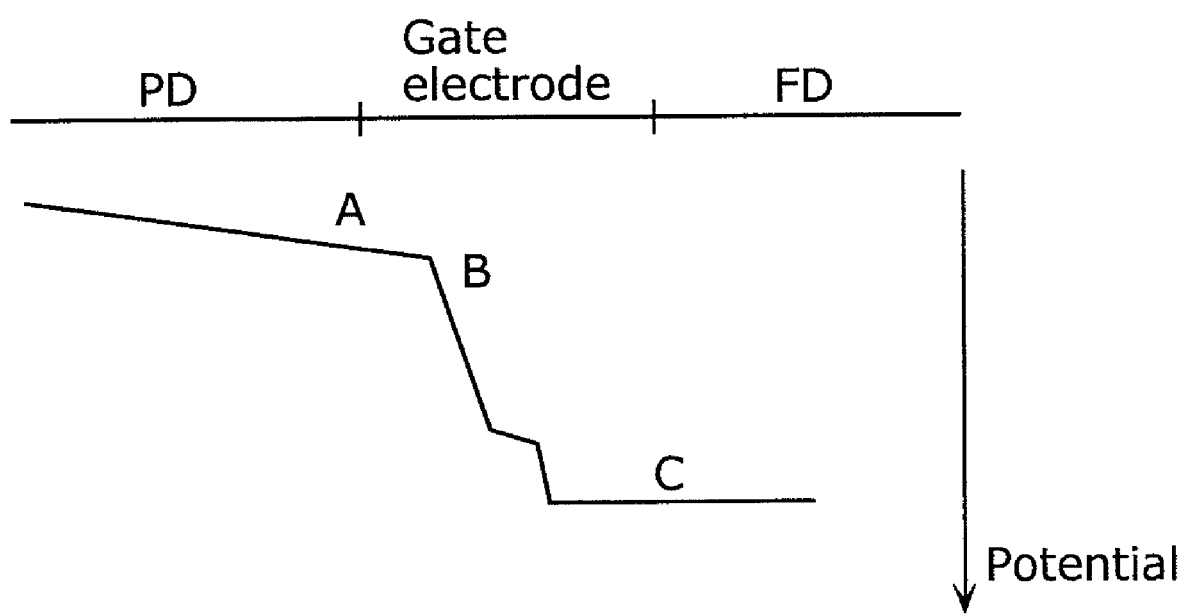
FIG. 8 is a schematic diagram which shows changes in the potential from the photodiode to the FD unit.

FIG. 8 is a schematic diagram which shows the potential from the photodiode to the FD unit when the non-boosted transfer pulse is used, as a modification of the driving method. The potential under the gate of the transfer transistor while transferring the charge can be inclined in stages towards the photodiode side.

Figure 9:
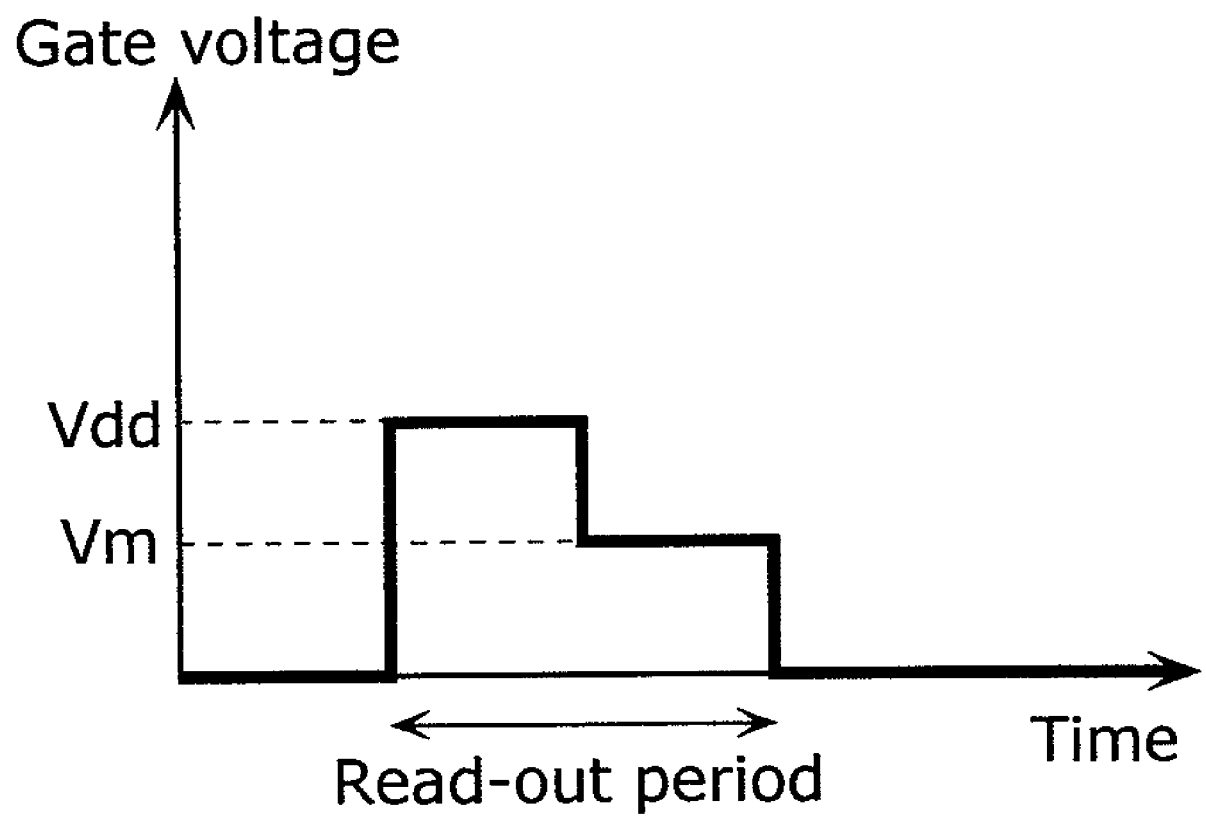
FIG. 9 is a diagram which shows the driving method in a modification of the driving method.

FIG. 9 is a diagram which shows a non-boosted transfer pulse, as a modification of the driving method. Vm in FIG. 9 is an intermediate voltage of the power source voltage Vdd and ground level intermediate voltage (for example, 1.5V). Since the transition is a two-stage model, charge reflux can be more reliably prevented when the charge is read out. However, a rectangular pulse may be used instead of the transfer pulse.

Below, a manufacturing method for the solid-state imaging device in the present embodiment is explained using diagrams.

FIG. 10A through FIG. 10M are explanatory diagrams which show a process sequence of the first manufacturing method of the solid-state imaging device in the present embodiment. The first manufacturing method includes a step of implanting impurities at a first concentration into a substrate-side region, which is the read-out control implantation layer 1 (FIG. 10I) and a step of forming a read-out control implantation layer 1 by implanting impurities at a second concentration which is less concentrated than the first concentration into the surface side region which is the read-out control implantation layer 1 (FIG. 10J). Below, the process sequences are explained.

Figure 10A:
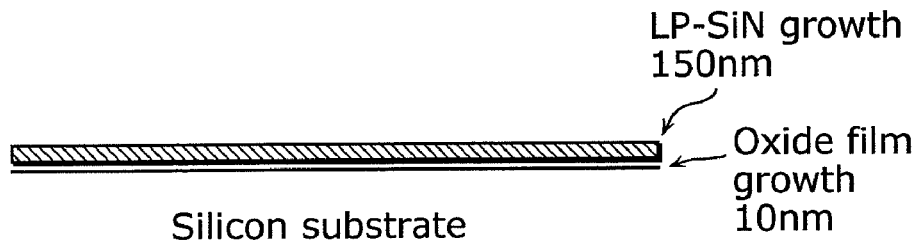
FIG. 10A is a diagram which shows a first manufacturing method of the solid-state imaging device.

As shown in FIG. 10A, a silicon oxide film is grown on the semiconductor substrate (for example 10 nm), and a silicon nitride film (for example, 150 nm) is grown using the low-pressure chemical vapor deposition (LP-CVD) technique, and so on.

Figure 10B:
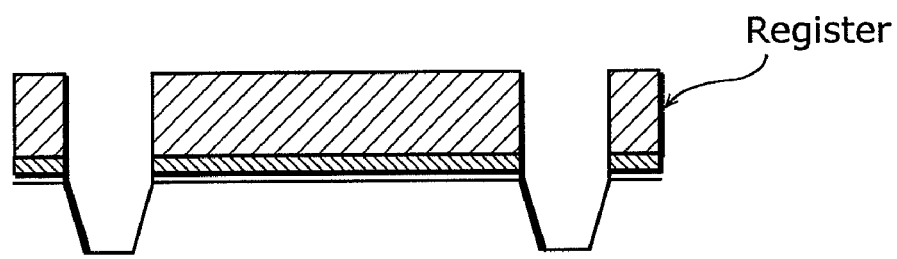
FIG. 10B is a diagram which shows a first manufacturing method of the solid-state imaging device.

As shown in FIG. 10B, a trench is formed using resistance coating, exposure and development.

Figure 10C:
FIG. 10C is a diagram which shows a first manufacturing method of the solid-state imaging device.

As shown in FIG. 10C, a sidewall of the trench is oxidized and an oxide film (for example, 15 nm) is formed.

Figure 10D:
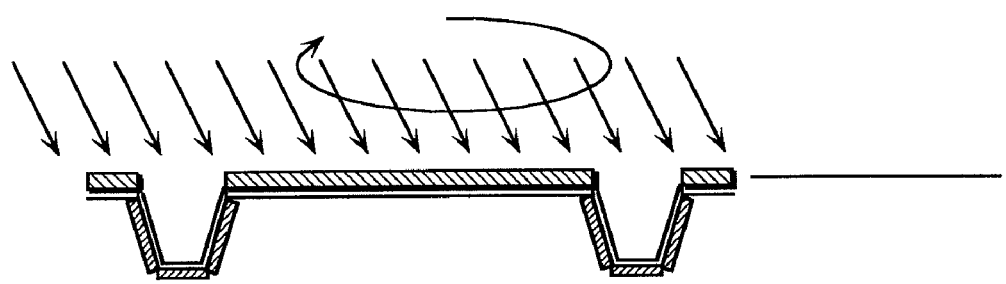
FIG. 10D is a diagram which shows a first manufacturing method of the solid-state imaging device.

As shown in FIG. 10D, for example, a defect suppression layer is formed by changing the implantation angle and implanting $8.0 \times 10^{12}/cm^2$ boron at an energy of 30 keV and implanting ions multiple times.

Figure 10E:
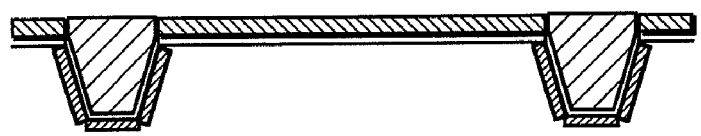
FIG. 10E is a diagram which shows a first manufacturing method of the solid-state imaging device.

As shown in FIG. 10E, the oxide film is embedded in the trench and flattened using the Chemical Mechanical Polishing technique (CMP) and so on.

Figure 10F:
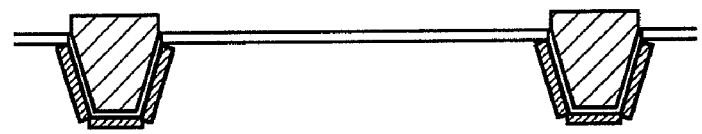
FIG. 10F is a diagram which shows a first manufacturing method of the solid-state imaging device.

As shown in FIG. 10F, the SiN film is removed.

Figure 10G:
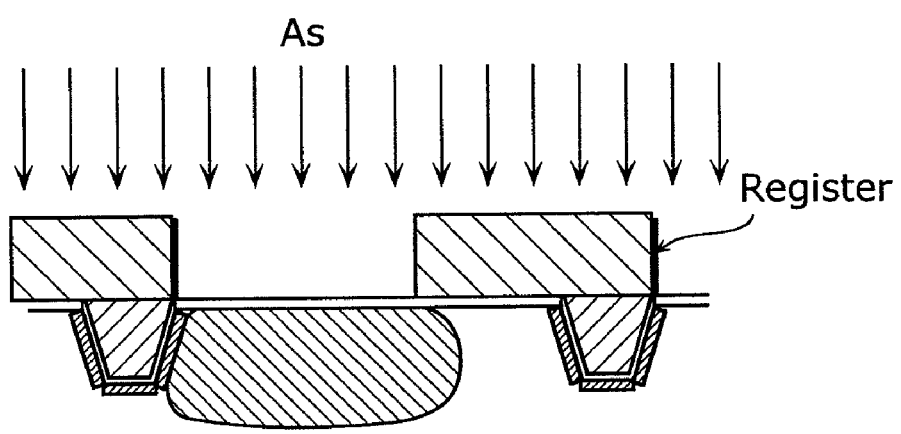
FIG. 10G is a diagram which shows a first manufacturing method of the solid-state imaging device.

As shown in FIG. 10G, a register is formed outside of the region in which the photodiode forms, and for example, a photodiode diffusion layer 8 is formed by implanting $2.0 \times 10^{12}/cm^2$ Arsenic As ions at an energy of 600 keV.

Figure 10H:
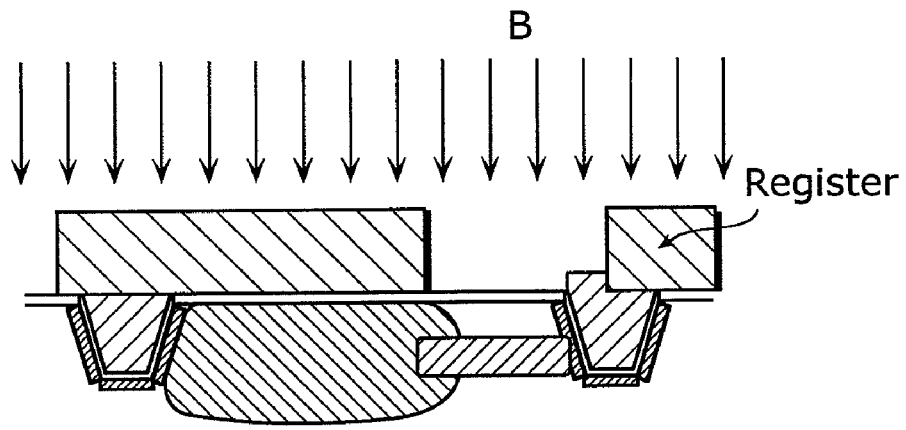
FIG. 10H is a diagram which shows a first manufacturing method of the solid-state imaging device.

As shown in FIG. 10H, for example, an anti-punch through layer 2 is formed by implanting $1.0 \times 10^{12}/cm^2$ Boron B ions at an energy of 100 keV.

Figure 10I:
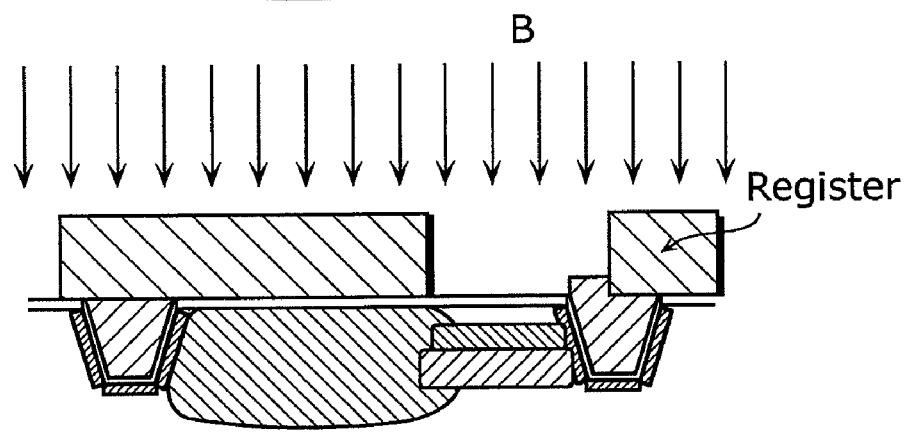
FIG. 10I is a diagram which shows a first manufacturing method of the solid-state imaging device.
Figure 10J:
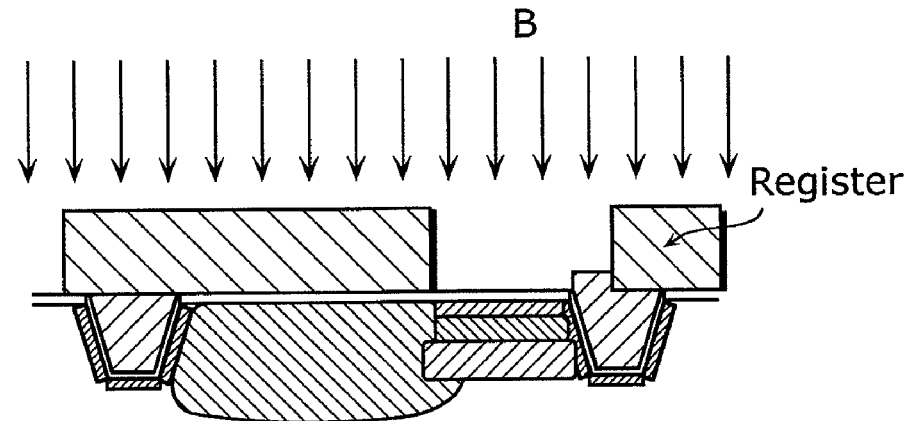
FIG. 10J is a diagram which shows a first manufacturing method of the solid-state imaging device.

As shown in FIG. 10I, for example, the substrate-side region of the read-out control implantation layer is formed by implanting $2.0 \times 10^{11}/cm^2$ Boron B ions at an energy of 10 keV.

As shown in FIG. 10J, for example, the substrate-side region of the read-out control implantation layer is formed by implanting $5.0 \times 10^{11}/cm^2$ Boron B ions at an energy of 5 keV. Thus, the impurity concentration in the read-out control implantation layer becomes denser than the surface of the semi-conductor substrate.

Figure 10K:
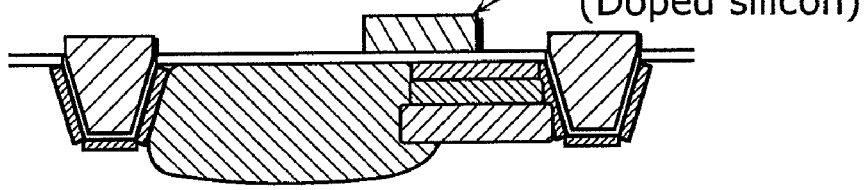
FIG. 10K is a diagram which shows a first manufacturing method of the solid-state imaging device.

As shown in FIG. 10K, after the oxide layer etching, and the gate oxidization, a read electrode is formed.

As shown in FIG. 10L, a photodiode diffusion layer 8 is formed, for example, by implanting $1.0 \times 10^{12}/cm^2$ Boron B ions at an energy of 6 keV.

As shown in FIG. 10M, an FD layer 10 is formed by implanting $4.0 \times 10^{12}/cm^2$ phosphorous P ions at an energy of 50 keV and implanting $2.0 \times 10^{12}/cm^2$ Boron B ions at an energy of 30 keV.

As shown in FIG. 10N, after the wiring process, an inter-layer insulator, a shielding layer, an overcoat and so on are formed.

As above, the first manufacturing method includes a step of implanting impurities at the first concentration into the substrate-side region which is the read-out control implantation layer 1 and a step of forming a read-out control implantation layer 1 by implanting impurities at the second concentration, which is less concentrated than the first concentration, into the surface side region which is the read-out control implantation layer 1.

(Second Manufacturing Method)

Figure 11A:
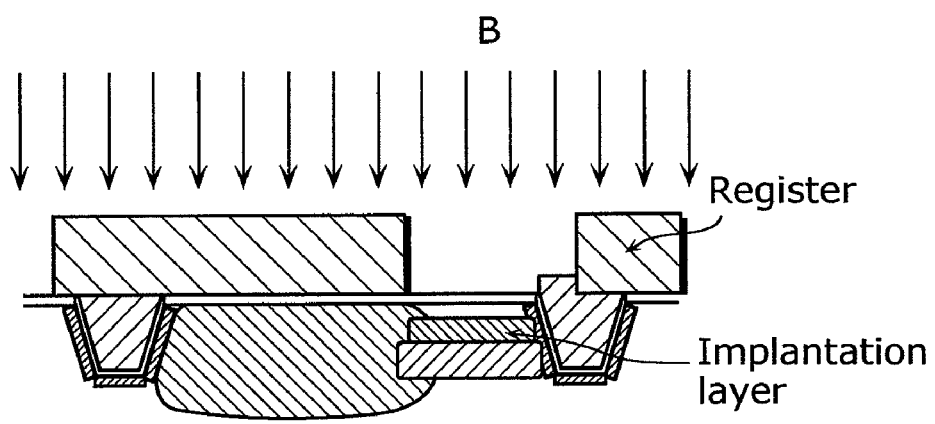
FIG. 11A is a diagram which shows a second manufacturing method of the solid-state imaging device.
Figure 11B:
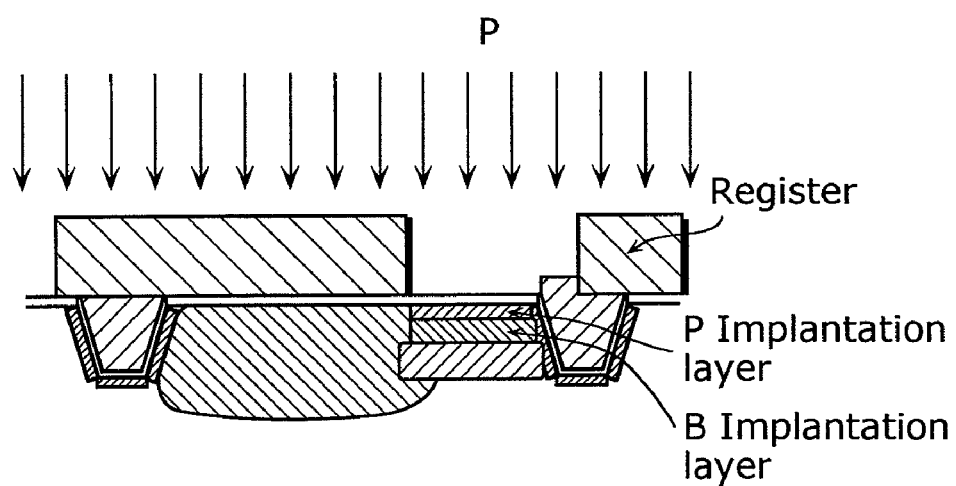
FIG. 11B is a diagram which shows a second manufacturing method of the solid-state imaging device.

FIG. 11A and FIG. 11B are explanatory diagrams which show the second manufacturing method for the solid-state imaging device in a process sequence. The second manufacturing method differs from the first manufacturing method in that the processes in FIG. 11A and FIG. 11B are performed instead of those of FIG. 10I and FIG. 10J. In other words, the second manufacturing method includes a step of implanting a first conduction type impurity at the first concentration into the region which is the read-out control implantation layer (FIG. 11A) and a step of forming a read-out control implantation layer by implanting a second type conductive impurity at the second concentration, which is less concentrated than the first concentration, into the surface side region which is the read-out control implantation layer (FIG. 11B). Below, explanations for the same processes are not repeated, and the present invention is explained for different processes.

As shown in FIG. 11A, for example, the substrate-side region of the read-out control implantation layer is formed by implanting $2.5 \times 10^{12}/cm^2$ Boron B ions at an energy of 10 keV.

As shown in FIG. 11B, for example, the substrate-side region which is the read-out control implantation layer is formed by implanting $3.0 \times 10^{11}/cm^2$ Phosphorous P ions at an energy of 15 keV. Thus, the impurity concentration in the read-out control implantation layer 1 becomes denser than the surface of the semi-conductor substrate.

(Third Manufacturing Method)

Figure 12A:
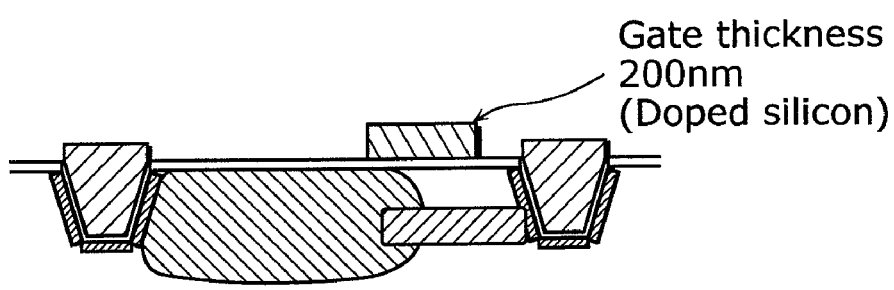
FIG. 12A is a diagram which shows a third manufacturing method of the solid-state imaging device.
Figure 12B:
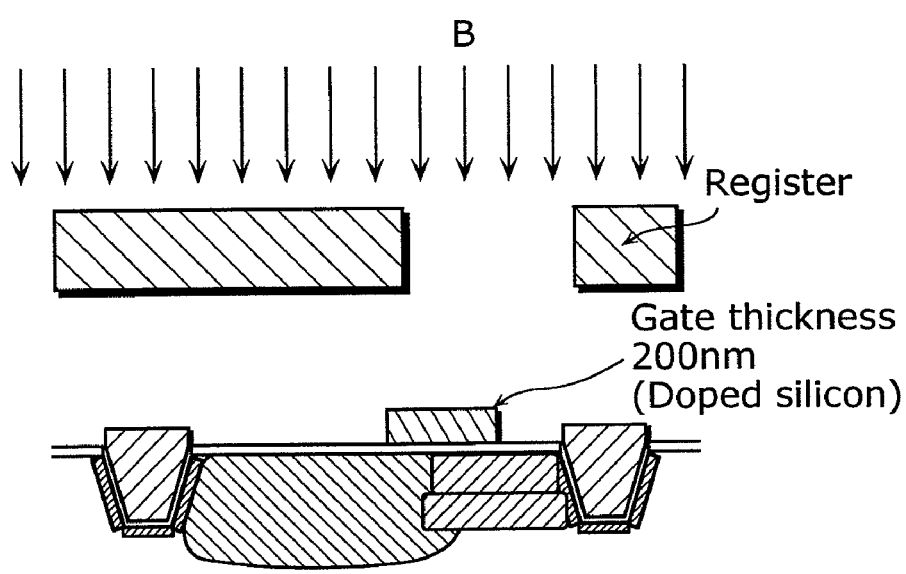
FIG. 12B is a diagram which shows a third manufacturing method of the solid-state imaging device.

FIG. 12A and FIG. 12B are explanatory diagrams which show a process sequence of the third manufacturing method of the solid-state imaging device in the present embodiment. The third manufacturing method differs from the first manufacturing method in that the processes in FIG. 12A and FIG. 12B are performed instead of FIG. 10I, FIG. 10J and FIG. 10K. In other words, the second manufacturing method includes a step for forming a gate for the transfer transistor 6 after forming the photodiode 8 (FIG. 12A), and a step for implanting impurities into a region, which is a control implantation layer, after forming the gate (FIG. 12B). Below, the explanations for the same processes are not repeated, and the present invention is explained for different processes.

As shown in FIG. 12A, after the gate oxide layer is formed, a read-out control implantation layer is formed before the gate electrode is formed. Here, the read-out control implantation layer is activated by a Rapid Thermal Annealing (RTA) process at 650° C. in 30 seconds.

As shown in FIG. 12B, for example, a region is formed which is a read-out control implantation layer by implanting $2.0 \times 10^{12}/cm^2$ Boron B ions at an energy of 20 keV. Here, the read-out control implantation layer is activated by an RTA process. Thus, the impurity concentration of the read-out control implantation layer can be manufactured such that the substrate-side is more concentrated than the surface side.

According to the solid-state imaging device in the present embodiment explained above, the sub-gate potential of the transfer transistor can be inclined in stages when the charge is transferred, since the substrate-side forms a read-out control implantation layer 1 which is more concentrated around the surface as a charge transfer path from the photodiode 5 to the FD unit 10.

As a result, a charge reflux to the photodiode 5 can be prevented in the transition period while the transfer transistor 6 changes from ON to OFF. As a result, since the signal charge of the photodiode 5 is not lost and can be read out of the FD unit 10, the read-out properties of the solid-state imaging device are excellent, and the saturation and after-image properties can be improved. Also, the read-out properties are excellent and the saturation and after-image properties can be improved even when the potential of the charge transfer path in the FD unit 10 has been increased to more than that of the FD unit 10 by applying voltage higher than the FD unit 10 to the gate of the transfer transistor 6.

Further, the sub-gate potential from when the transfer transistor 6 is turned ON to when it is turned OFF is temporarily held at a potential lower than the FD unit and further, lower than the potential of the control implantation layer, due to the transfer pulse which falls in two stages. Therefore, a complete read-out of the photodiode can be performed more reliably. Deterioration in the read properties as well as deterioration in the saturation properties can be prevented, and reliability can be improved.

Note that it is ideal that impurities in the FD unit 10 and the border of the read-out control implantation layer 1 below the gate in the solid-state imaging device be formed on the interior of the read-out gate. A cross-section of the solid-state imaging device in this case is shown in FIG. 13. As shown in the figure, a border surface P between the FD unit 10 and the read-out control implantation layer 1 is formed in the position closer to the photodiode 5 than the gate end Q on the FD unit 10 side. The after-image property can be further improved by performing this kind of structure and process.

Also, implantation of impurities in FIG. 10I and FIG. 10J may be performed in reverse order. Implantation of impurities in FIG. 11A and FIG. 11B may also be performed in reverse order.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device according to the present invention can realize a solid-state imaging device which for the most part does not generate after-image defects in the photodiode capacity when the gate voltage is set to a higher voltage than the FD unit in order to improve the read-out properties, and is useful as a solid-state imaging device in which plural photoelectric conversion units are allocated in an array, a driving method thereof and a camera which utilizes the driving method.

What is claimed is:

1. A solid-state imaging device comprising plural pixel cells arranged on a surface of a semi-conductor substrate opposite a bottom surface, and a driving unit installed on the semi-conductor substrate in order to drive each pixel cell, wherein each pixel cell comprises:
    a photodiode which converts incident light into a signal charge;
    a transfer transistor which transfers the signal charge of said photodiode to a floating diffusion unit;
    said floating diffusion unit which accumulates the transferred signal charge; and
    a control implantation layer which is positioned under a gate of said transfer transistor, and becomes a charge transfer path when the charge is transferred from said photodiode to said floating diffusion unit,
    wherein an impurity concentration of said control implantation layer is denser toward the bottom of the substrate than toward the surface of the semi-conductor substrate.

2. The solid-state imaging device according to claim 1,
    wherein said driving unit includes a boosting circuit which boosts a power source voltage, and is operable to apply the voltage boosted by said boosting circuit to the gate of said transfer transistor as a transfer pulse for transferring the signal charge from said photodiode to said floating diffusion unit.

3. The solid-state imaging device according to claim 1, wherein said driving unit is operable to supply a transfer pulse, which falls in two stages, to said transfer transistor, as the transfer pulse from said photodiode to said floating diffusion unit.

4. The solid-state imaging device according to claim 1, wherein said photodiode is formed at a deeper position than said control implantation layer.

5. The solid-state imaging device according to claim 1, wherein a boundary surface of said floating diffusion unit and said control implantation layer is formed closer to said photodiode than a gate end on the side of said floating diffusion unit.

* * * * *